United States Patent [19]

Olshansky

[11] Patent Number: 4,679,199
[45] Date of Patent: Jul. 7, 1987

[54] HIGH POWER INGAASP/INP SEMICONDUCTOR LASER WITH LOW-DOPED ACTIVE LAYER AND VERY LOW SERIES RESISTANCE

[75] Inventor: Robert Olshansky, Wayland, Mass.

[73] Assignee: GTE Laboratories Incorporated, Waltham, Mass.

[21] Appl. No.: 779,012

[22] Filed: Sep. 23, 1985

[51] Int. Cl.⁴ .............................................. H01S 3/19
[52] U.S. Cl. ........................................ 372/44; 372/48
[58] Field of Search ............................. 372/44, 45, 48

[56] References Cited

U.S. PATENT DOCUMENTS 4,445,218 4/1984 Coldren ................................ 372/44

OTHER PUBLICATIONS

Mito et al., InGaAsP Double Channel Planar Buried-Heterostructure Laser Diode (DC-PBH LD) with Effective Current Confinement, IEEE, Mar. 1983, Jour. of Lightwave Tech., vol. LT 1, No. 1.

Primary Examiner—Gene Wan
Attorney, Agent, or Firm—Fred Fisher

[57] ABSTRACT

In conventional InGaAsP/InP semiconductor lasers the p-doping in the InP laser level cannot be increased above $1 \times 10^{18}$ atoms/cm$^3$ without adversely affecting the optical characteristics of the devices. However, by introducing a thin low-doped p-InP layer and a thicker highly doped InP layer, good optical characteristics can be maintained and series resistance can be reduced by a factor of 2 to 4, thereby resulting in operable devices having significantly increased operating currents and higher output power than those of the prior art.

10 Claims, 4 Drawing Figures

LEGEND

| Layer | No. |
|---|---|
| P-InGaAsP CAP | 17 |
| P-InP CLADDING | 16 |
| P-InP CLADDING | 15 |
| InP REGROWN | 14 |
| InGaAsP ACTIVE | 13 |
| n-InP BUFFER | 12 |
| n-InP SUBSTRATE | 11 |

HIGH POWER INGAASP/INP SEMICONDUCTOR LASER WITH LOW-DOPED ACTIVE LAYER AND VERY LOW SERIES RESISTANCE

CROSS-REFERENCE TO RELATED APPLICATION

The teachings of this instant invention can be applied to a variety of semiconductor devices including, for example, those prepared through vapor phase regrowth, as set forth in U.S. patent application Ser. No. 750,442 now abandoned application by William Powazinik, Robert Olshansky (the applicant hereof), and Robert B. Lauer, entitled "Vapor Phase Regrowth of Semiconductor Devices", filed July 1, 1985 and assigned to the assignee hereof.

BACKGROUND OF THE INVENTION

1. Field of the Invention

This invention relates to new and improved high power InGaAsP/InP semiconductor lasers having good optical characteristics with a very low series resistance that are able to operate at significantly increased operating currents and are able to produce higher output power than corresponding devices of the prior art. Accordingly, it is the general object of this invention to provide new and improved semiconductor lasers of such character.

2. General Background

For various applications, it is desirable to produce semiconductor lasers having as low a series resistance as possible so as to minimize the amount of heating that tends to occur during continuous-wave operation and to reduce the IR voltage drop which occurs across the cladding layer. The satisfaction of such a desideratum is particularly important for high power devices that operate at high currents, for very high frequency devices which operate at high CW bias, and for short cavity length devices which have much higher than normal series resistance due to reduced cavity length.

Typically, a conventional InGaAsP/InP semiconductor laser has a single p-doped InP layer associated therewith. Series resistance can be normally minimized by making the p-doped InP layer as thin as possible (1 to 2 microns) and as heavily p-doped as possible. Disadvantageously, however, in conventional InGaAsP/InP laser manufacture, when the p-InP layer is doped above $1 \times 10^{18}$ atoms/cm$^3$, the p-dopant (such as zinc) diffuses into the active layer, and producing increased threshold currents and decreased differential quantum efficiencies. See, for example, the following publications:

1. "Low Threshold Current Density (100) GaInAsP-/InP Double Heterostructure Lasers for Wavelength 1.3 μm", Y. Itaya, Y. Suematsu, S. Katayama, K. Kishino and S. Arai, Jap. J. Appl. Phys., Vol. 18, No. 9, pp. 1795-1805 (1979).

2. "InGaAsP Double-Channel-Planar-Buried-Heterostructure Laser Diode (DC-PBH LD) with Effective Current Confinement", I. Mito, M. Kitamura, K. Kobayashi, S. Murata, M. Seki, Y. Odagiri, H. Nishimoto, M. Yamaguchi and K. Kobayashi, J. Lightwave Tech., Vol. LT-1, No. 1, pp. 195-202 (1983).

3. "Fabrication, Characterization, and Analysis of Mass-Transported GaInAsP/InP Buried-Heterostructure Lasers", Z.L. Liau, J.N. Walpole, D.Z. Tsang, IEEE J. Quantum Electronics, Vol. QE-20, No. 8, pp. 855-865 (1984).

The reduction of the series resistance in the p-InP layer has various advantages. For example, ohmic heating is reduced. Also, the IR voltage drop which occurs across the p-doped InP layer can serve to turn-on either the PN InP homojunction which blocks shunt currents (as discussed by Z. Liau et al., cited hereinabove) or the PNPN current blocking layer (as suggested by H. Namizaki, R. Hirano, H. Higuchi, E. Oomura, Y. Sakakibara, W. Susaki, Electron. Letts., Vol. 18, No. 16, pp. 703-705 (1982). Thus, it is desirable to dope the p-InP region as highly as possible.

A number of studies have indicated that when the zinc concentration in the p-InP layer is above $1 \times 10^{18}$ atoms/cm$^3$, too much zinc diffuses into the active layer and the device properties actually become worse, as set forth, for example, in articles by Itaya et al. and Z.L. Liau et al., both cited hereinabove. The instant invention set forth hereinafter provides for a convenient means of increasing the zinc concentration in the p-InP layer to reduce the series resistance while simultaneously maintaining low zinc concentration in the active region.

SUMMARY OF THE INVENTION

Another object of this invention is to provide a new and improved InGaAsP/InP semiconductor laser having beneficial optical characteristics that can be maintained and having a series resistance that is substantially reduced over those of the prior art.

Yet another object of this invention is to provide a new and improved InGaAsP/InP semiconductor laser that can operate at significantly increased operating currents and that produces higher output power than corresponding devices of the prior art.

In accordance with one aspect of the invention, a high power InGaAsP/InP semiconductor laser with low-doped active layer and very low series resistance includes an n-doped InP substrate and a buffer layer of n-doped InP deposited on the substrate. An active layer of InGaAsP is deposited on the buffer layer. A low p-doped cladding layer is deposited on the active layer. A high p-doped cladding layer is deposited on the low p-doped cladding layer, and a p-doped cap layer of InGaAsP is deposited on the high p-doped cladding layer.

In accordance with another aspect of the invention, a high power InGaAsP/InP semiconductor laser with low doped active layer and very low series resistance includes an n-doped InP substrate and a buffer layer of n-doped InP deposited on the substrate. An active layer of InGaAsP is deposited on a portion of the buffered layer. A regrown layer of InP is deposited on other portions of the buffer layer, the regrown layer abutting the active layer. A low p-doped cladding layer is deposited upon the active layer and affixed to the regrown layer. A high p-doped cladding layer is deposited on the low p-doped cladding layer, and a p-doped cap layer of InGaAsP is deposited on the high p-doped cladding layer.

In accordance with certain features of the invention which can be applied to either of the foregoing embodiments, the high p-doped cladding layer is thicker than the low p-doped cladding layer. The substrate is n-doped with a concentration of about $2 \times 10^{18}$ atoms cm$^{-3}$. The buffer layer is n-doped with a concentration of about $2 \times 10^{18}$ atoms/cm$^{-3}$. The active layer is not intentionally doped. The low p-doped cladding layer is zinc doped with a concentration of about $8 \times 10^{17}$ atoms/cm$^3$ [1,3]. The high p-doped cladding layer is zinc doped with a concentration of about $5 \times 10^{18}$ atoms/cm$^{-3}$, and the cap layer is zinc doped with a concentration of about $5 \times 10^{18}$ atoms/cm$^{-3}$.

In accordance with other features, the low p-doped cladding layer can be zinc doped to a concentration of about $8 \times 10^{17}$ atoms/cm$^{-3}$, and the high p-doped cladding layer can be zinc doped to a concentration of about $8 \times 10^{18}$ atoms/cm$^{-3}$. The semiconductor laser can have a low p-doped cladding layer which is about 0.2 to 0.4 micron and the high p-doped cladding layer can have a thickness about 1 to 2 microns.

BRIEF DESCRIPTION OF THE DRAWINGS

Other objects, advantages, and features of this invention, together with its construction and mode of operation, will become more apparent with the following description, when read in conjunction with the accompanying drawings, in which.

DESCRIPTION OF PREFERRED EMBODIMENTS

Typically, a semiconductor laser wafer is grown by one of the known epitaxial processes such as liquid phase epitaxy, vapor phase epitaxy, metal organic chemical vapor deposition, and the like. Once the active layer is grown, a zinc doped p-type InP layer can be grown on top thereof, and then an additional p-type InGaAsP cap layer is grown thereonto. Disadvantageously, zinc introduced during the growth of the p-InP layer diffuses into the active layer, as suggested, for example, by Y. Itaya et al. and Z.L. Liau et al. in their articles cited hereinabove, and also by Y. Sasai, Y. Yoshioka and N. Hase, "Auto-Doping Phenomena for the InGaAsP Active Layer in DH Structure Grown by LPE", Japanese Journal of Applied Physics, Vol. 23, No. 9, pp. L700–L702 (1984). Such diffusion of zinc into the active layer can cause high threshold current and low differential quantum efficiency.

Figure 1:
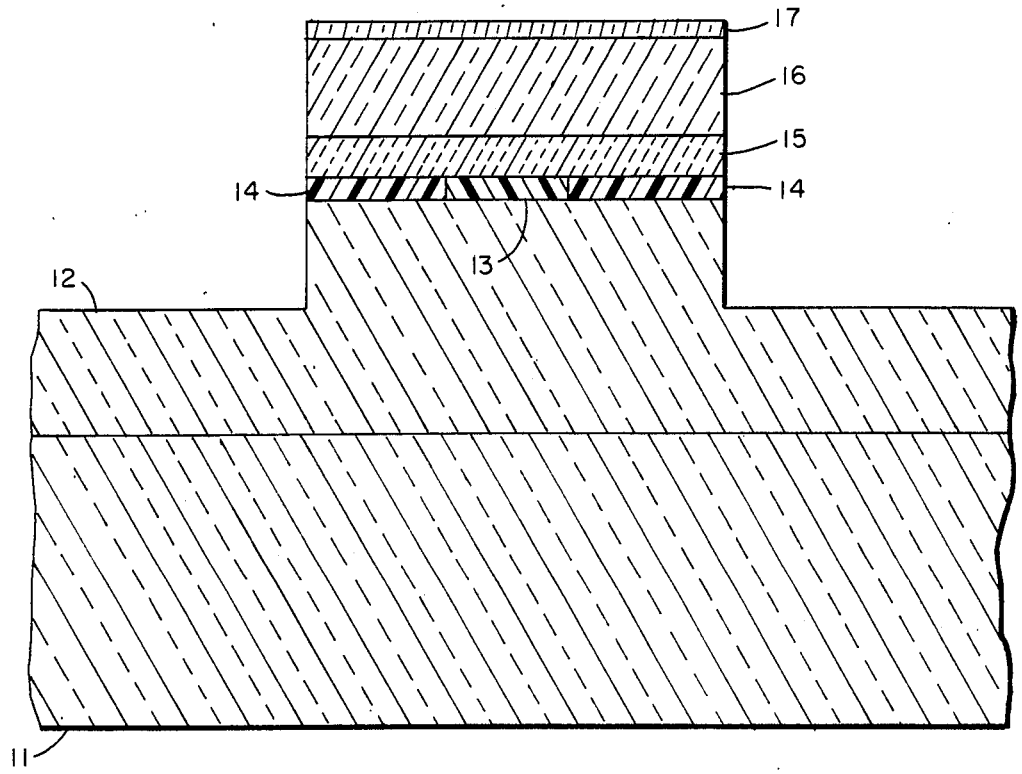
FIG. 1 is a cross-sectional diagram of a semiconductor laser constructed in accordance with the teachings of this invention.

As taught by this invention, rather than growing a single p-type InP layer, it is recognized that a significant advantage can be obtained by growing two p-type InP layers. The first layer is a relatively thin (0.1 to 0.3 micron) layer, relatively low doped (5 to $10 \times 10^{17}$ atoms/cm$^3$), with zinc (or another p-dopant, such as, for example, cadmium), and the second is a relatively thick (1 to 2 microns) layer, more highly doped (2 to $5 \times 10^{18}$ atoms/cm$^3$), with zinc or another p-dopant. As the diffusion depth of zinc during crystal growth appears to be no more than a few tenths of a micron (as suggested by Y. Sasai et al. cited hereinabove), the thin low doped layer serves as a buffer layer and prevents the active layer from becoming highly zinc doped. The second layer represents the bulk of the p-type InP layer. The 1 to 2 microns thickness preserves the good optical characteristic of the device. Because of the presence of the thin p-buffer layer, the thick layer can be made highly doped. The series resistance can be reduced to the lowest possible value, and the voltage drop across the combined p-InP layers can be made as small as possible. Referring to FIG. 1, there is shown a cross-section of a semiconductor laser constructed in accordance with the teachings of this invention.

The semiconductor laser includes an n-doped InP substrate 11 which can have a concentration of about $2 \times 10^{18}$/cm$^3$. The n-dopant can be sulfur or tin, for example. A buffer layer 12 is applied thereto, the buffer layer 12 being an n-doped layer having a concentration of about $2 \times 10^{18}$ atoms cm$^{-3}$. An active layer 13 is deposited upon the buffer layer 12. The active layer 13 is not intentionally doped. In the embodiment depicted in FIG. 1, there is further shown an InP regrown layer 14 which is deposited on other portions of the buffer layer 12 in such a manner as to abut the active layer 13. This specific embodiment is clear from a view of FIG. 1.

A low p-doped cladding layer 15 is deposited upon the active layer 13 and is further affixed to the regrown layer 14. A highly p-doped cladding layer 16 is deposited onto the low p-doped cladding layer 15. A p-doped cap layer 17 of InGaAsP is deposited onto the high p-doped cladding layer 16.

The process of vapor phase regrowth, including the generation of a regrown layer, is described more fully in the Powazinik application, cited above. The subject matter thereof is incorporated herein by reference.

The low p-doped InP cladding layer 15, by way of example, can be 0.2 micron thick and the zinc concentration can be on the order of $8 \times 10^{17}$ atoms/cm$^3$. The layer 16 can be a p-doped InP cladding layer having a thickness of 1.3 microns and a zinc concentration of $5 \times 10^{18}$ atoms/cm$^3$ and the cap layer can be a p-doped layer of InGaAsP having a 0.5 micron thickness with a zinc concentration of $5 \times 10^{18}$ atoms/cm$^3$.

ILLUSTRIOUS EXAMPLE

In comparing the advantages of applicant's invention to that of the prior art, consider a high power laser with an active layer having a width w of 1.5 microns and having a length L of 200 microns. Assume that the p-InP layer has a thickness t of 1.5 microns. To keep the internal loss low and the differential quantum efficiency as high as possible, the typical single p-doped InP layer is doped with zinc at the concentration p of $8 \times 10^{17}$ atoms/cm$^3$ in a conventional design. The hole mobility of this material is 60 cm$^2$/v-s and the series resistance R can be calculated from the relationship $R = t/(q\ pwL)$.

The result R is 6.5 ohms. At 100 mA operating current, the I$^2$R power dissipated would be 65 mW and the IR voltage drop is 0.65 volt.

Through the use of the instant invention, one would grow a 0.2 micron thick layer doped at $8 \times 10^{17}$ atoms/cm$^3$ and a 1.3 microns thick doped $5 \times 10^{18}$ atoms/cm$^3$ layer. Assuming that the hole mobility of the highly doped layer is 40 cm$^2$/v-s, the series resistance of such a device becomes 2.2 ohms.

Thus, both the I$^2$R heating and the IR voltage drop are reduced by a factor of three in accordance with the teachings of this invention. Both factors thus enable the device to be operated at significantly increased drive current and at increased output power.

Figure 2:
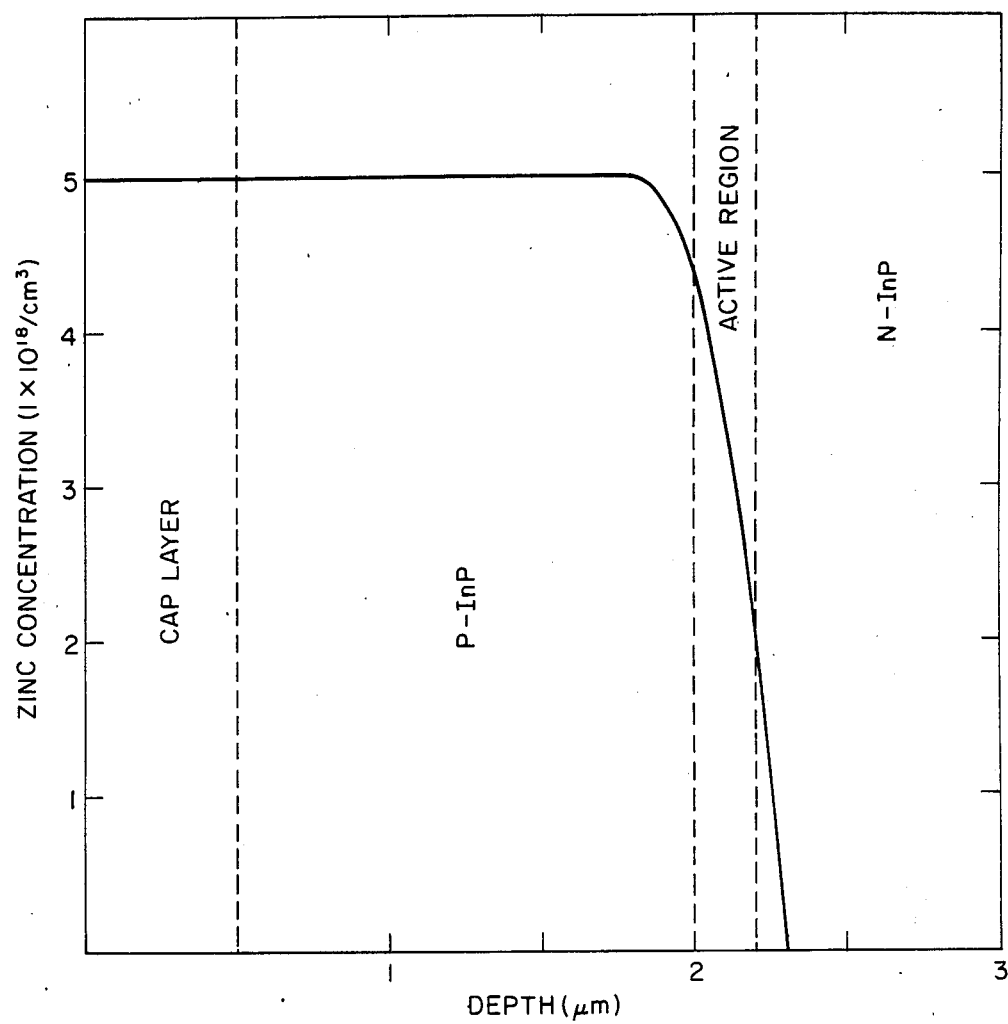
FIG. 2 is a chart of zinc concentration vs. depth in a conventional laser having a highly doped p-InP layer.

FIG. 2 is a chart of zinc concentration v. depth in a conventional laser having a highly doped p-InP layer. Zinc diffuses into the active layer (or region) during crystal growth, and causes high threshold currents and low differential quantum efficiency. Referring specifically to FIG. 2, it is noted that the cap layer has a zinc concentration of about $5 \times 10^{18}$ atoms/cm$^3$. The 1.5 microns thick p-doped InP layer has a zinc concentration of about $5 \times 10^{18}$ atoms/cm$^3$. The p-InP layer has a $5 \times 10^{18}$ atoms/cm$^3$ zinc concentration through most of its depth, tapering downwardly, slightly, as the p-doped layer of InP abuts the active region.

The zinc concentration of the active region, as shown in FIG. 2, varies from about $4.4 \times 10^{18}$ atoms/cm$^3$ to approximately $2 \times 18^{18}$ atoms/cm$^3$. Furthermore, some of the contamination from zinc travels through into the n-InP layer ranging from about $2 \times 10^{18}$ atoms/cm$^3$ down to about $1 \times 10^{17}$ atoms/cm$^3$.

Figure 3:
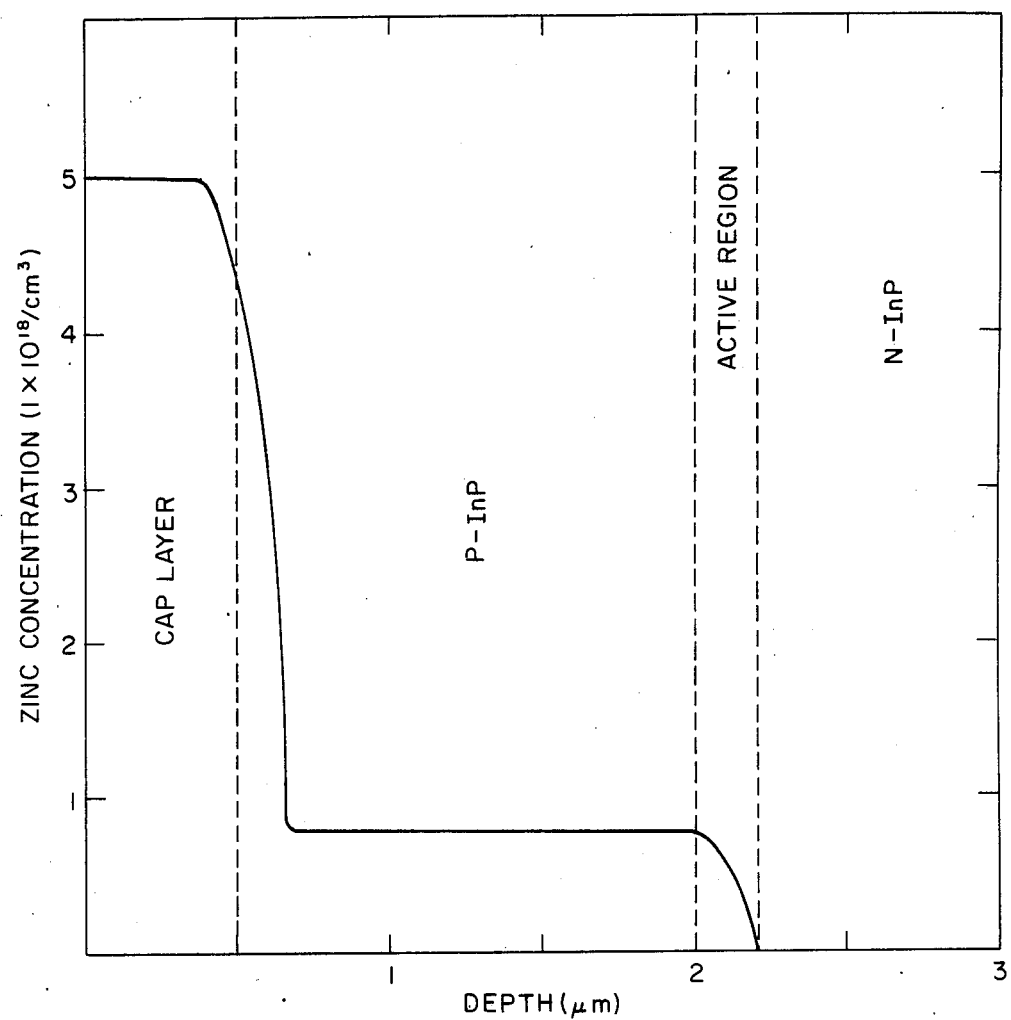
FIG. 3 is a chart of zinc concentration vs. depth in a conventional laser having a p-doped InP layer, doped at $8 \times 10^{17}$ atoms/cm$^3$.

Referring to FIG. 3, there is shown a chart of zinc concentration v. depth in the conventional laser having a p-doped InP layer doped at $8 \times 10^{17}$ atoms/cm$^3$. A low doped active layer is obtained, but the laser has a high series resistance. It is noted that the zinc concentration of the cap layer is on the order of $5 \times 10^{18}$ atoms/cm$^3$. Along a locus within the cap layer, approaching the p-doped InP layer, the zinc concentration drops off towards about $4.2 \times 10^{18}$ atoms/cm$^3$ and proceeds to drop down (within the p-doped InP layer) to about $0.8 \times 10^{18}$ atoms/cm$^3$, as the dopant contaminates a portion of the p-doped InP layer down to a thickness in the neighborhood of 0.2 micron. The dopant in the p-doped InP layer remains at about $0.8 \times 10^{18}$ atoms/cm$^3$.

As the p-doped InP layer abuts the active region, the zinc concentration within the active region varies from about $0.8 \times 10^{17}$/cm$^3$ down to about $0 \times 10^{17}$/cm$^3$. Thus, a low doped active layer is obtained; however, such a laser produced thereby has high series resistance.

Figure 4:
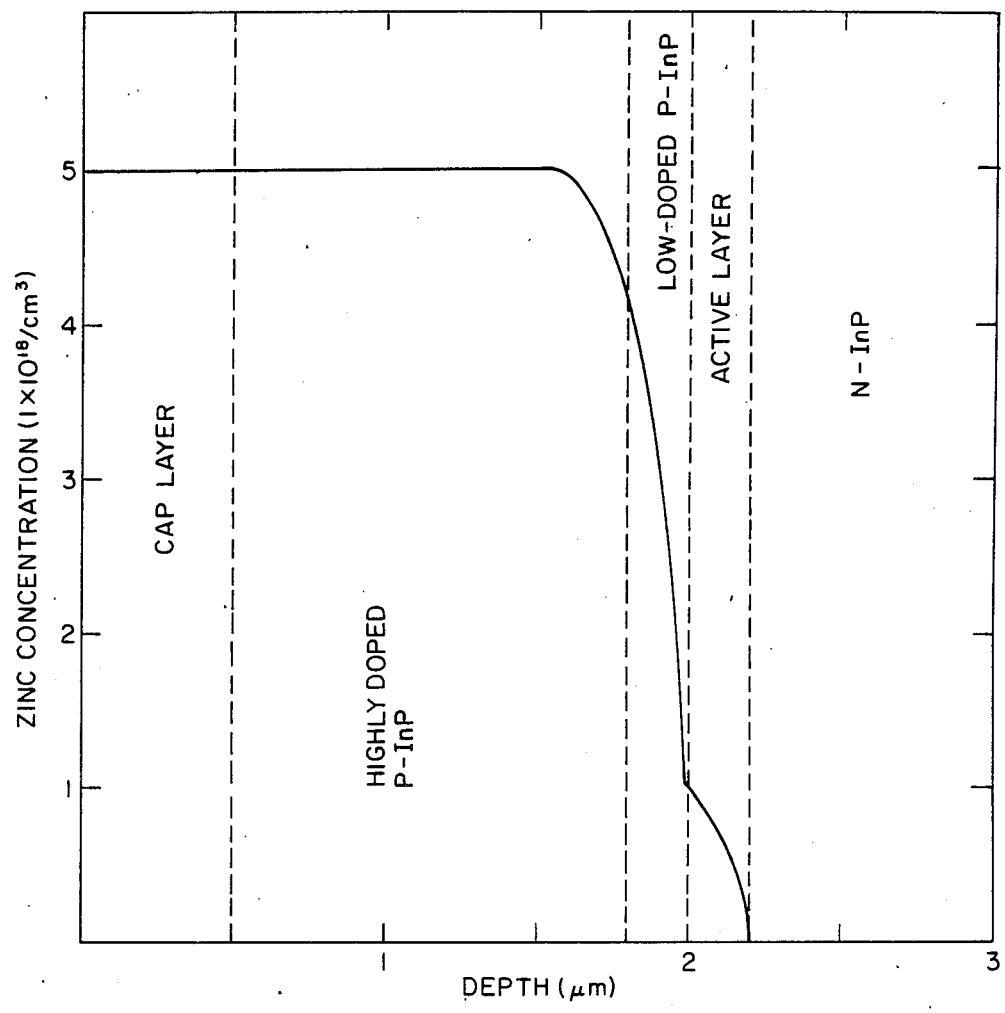
FIG. 4 is a chart of zinc concentration vs. depth for a semiconductor laser constructed in accordance with the teachings of this invention.

Referring specifically to FIG. 4, there is shown a chart of zinc concentration v. depth for a semiconductor laser constructed in accordance with the teachings of this invention. For example, a 0.2 micron thick low doped p-InP layer serves as a buffer layer, and prevents (or inhibits) zinc from the 1.3 microns thick highly doped p-InP layer from reaching the active layer. The resulting layer, thus, has low series resistance, together with an active layer having a low concentration of zinc.

Various modifications can be performed to this invention without departing from the spirit and scope thereof.

What is claimed is:

1. A high power InGaAsP/InP semiconductor laser with low-doped active layer and very low series resistance comprising
   an n-doped InP substrate;
   a buffer layer of n-doped InP deposited on said substrate;
   an active layer of InGaAsP deposited on said buffer layer;
   a low p-doped cladding layer deposited on said active layer;
   a high p-doped cladding layer deposited on said low p-doped cladding layer; and
   a p-doped cap layer of InGaAsP deposited on said high p-doped cladding layer.

2. The semiconductor laser as recited in claim 1 wherein said high p-doped cladding layer is thicker than said low p-doped cladding layer.

3. The semiconductor laser as recited in claim 1 wherein
   said substrate is n-doped with a concentration of about $2 \times 10^{18}$ atoms cm$^{-3}$,
   said buffer layer is n-doped with a concentration of about $2 \times 10^{18}$ atoms cm$^{-3}$,
   said active layer is not intentionally doped,
   said low p-doped cladding layer is zinc doped with a concentration of from $2 \times 10^{17}$ atoms cm$^{-3}$ to $8 \times 10^{17}$ atoms cm$^{-3}$,
   said high p-doped cladding layer is zinc doped with a concentration of from $1.5 \times 10^{18}$ atoms cm$^{-3}$ to $10 \times 10^{18}$ atoms cm$^{-3}$, and
   said cap layer is zinc doped with a concentration from $2 \times 10^{18}$ atoms cm$^{-3}$ to $10 \times 10^{18}$ atoms cm$^{-3}$.

4. The semiconductor laser as recited in claim 1 wherein
   said low p-doped cladding layer is zinc doped to a concentration of from $2 \times 10^{17}$ atoms cm$^{-3}$ to $8 \times 10^{17}$ atoms cm$^{-3}$, and
   said high p-doped cladding layer is zinc doped to a concentration of from $2 \times 10^{18}$ atoms cm$^{-3}$ to $10 \times 10^{18}$ atoms cm$^{-3}$.

5. The semiconductor laser as recited in claim 4 wherein
   said low p-doped cladding layer has a thickness of about 0.2 to 0.4 micron, and
   said high p-doped cladding layer has a thickness of about 1.0 to 2.0 microns.

6. A high power InGaAsP/InP semiconductor laser with low-doped active layer and very low series resistance comprising
   an n-doped InP substrate;
   a buffer layer of n-doped InP deposited on said substrate;
   an active layer of InGaAsP deposited on a portion of said buffer layer;
   a regrown layer of InP deposited on other portions of said buffer layer and abutting said active layer;
   a low p-doped cladding layer deposited upon said active layer, and affixed to said regrown layer;
   a high p-doped cladding layer deposited on said low p-doped cladding layer; and
   a p-doped cap layer of InGaAsP deposited on said high p-doped cladding layer.

7. The semiconductor laser as recited in claim 6 wherein said high p-doped cladding layer is thicker than said low p-doped cladding layer.

8. The semiconductor laser as recited in claim 6 wherein
   said substrate is sulfur-doped with a concentration of about $2 \times 10^{18}$ atoms cm$^{-3}$,
   said buffer layer is sulfur-doped with a concentration of about $2 \times 10^{18}$ atoms cm$^{-3}$,
   said active layer is not intentionally doped,
   said regrown layer is not intentionally doped,
   said low p-doped cladding layer is zinc doped with a concentration of about $8 \times 10^{17}$ atoms cm$^{-3}$,
   said high p-doped cladding layer is zinc doped with a concentration of about $5 \times 10^{18}$ atoms cm$^{-3}$, and
   said cap layer is zinc doped with a concentration of about $5 \times 10^{18}$ atoms cm$^{-3}$.

9. The semiconductor laser as recited in claim 6 wherein
   said low p-doped cladding layer is zinc-doped to a concentration of about $8 \times 10^{17}$ atoms cm$^{-3}$, and
   said high p-doped cladding layer is zinc-doped to a concentration of about $5 \times 10^{18}$ atoms cm$^{-3}$.

10. The semiconductor laser as recited in claim 9 wherein
    said low p-doped cladding layer has a thickness on the order of 0.2 micron, and
    said high p-doped cladding layer has a thickness on the order of 1.3 microns.

* * * * *